United States Patent
Xu et al.

(10) Patent No.: US 10,833,146 B2
(45) Date of Patent: Nov. 10, 2020

(54) HORIZONTAL-TRENCH CAPACITOR

(71) Applicant: International Business Machines Corporation, Armonk, NY (US)

(72) Inventors: Zheng Xu, Wappingers Falls, NY (US); Ruqiang Bao, Niskayuna, NY (US); Zhenxing Bi, Niskayuna, NY (US); Dongbing Shao, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/370,147

(22) Filed: Mar. 29, 2019

(65) Prior Publication Data
US 2020/0312951 A1    Oct. 1, 2020

(51) Int. Cl.
*H01L 49/02* (2006.01)
*H01L 21/02* (2006.01)
*H01L 29/06* (2006.01)

(52) U.S. Cl.
CPC ........ *H01L 28/60* (2013.01); *H01L 21/02694* (2013.01); *H01L 28/40* (2013.01);
(Continued)

(58) Field of Classification Search
CPC ............ H01L 21/7687; H01L 23/5223; H01L 27/0288; H01L 27/0629; H01L 27/0635;
(Continued)

(56) References Cited

U.S. PATENT DOCUMENTS 7,224,015 B1 * 5/2007 Skotnicki .......... H01L 27/10817
257/306
8,760,846 B1 * 6/2014 Snyder ................... H01G 11/26
361/326
(Continued)

OTHER PUBLICATIONS

Mertens et al., "Vertically Stacked Gate-All-Around Si Nanowire CMOS Transistors with Dual Work Function Metal Gates," 2016 IEEE International Electron Devices Meeting (IEDM) (Dec. 2016) (4 pages).
(Continued)

*Primary Examiner* — Eduardo A Rodela
(74) *Attorney, Agent, or Firm* — Robert Sullivan; Michael J. Chang, LLC

(57) ABSTRACT

Horizontal-trench on-chip capacitors are provided. In one aspect, a method of forming a capacitor includes: forming alternating sacrificial/active nanosheets on a wafer; patterning the nanosheets into a fin stack(s); burying the fin stack(s) in an ILD; removing the ILD from a first side of the fin stack(s), forming a first cavity; filling the first cavity with a semiconductor material that interconnects the nanosheets of the active material; implanting ions into the nanosheets, semiconductor material and wafer; removing the ILD from a second side of the fin stack(s) forming a second cavity; selectively removing the nanosheets of the sacrificial material, creating gaps between the nanosheets of the active material; depositing a dielectric into/lining the gaps and second cavity; and filling the gaps and second cavity with a conductor. A capacitor is also provided.

20 Claims, 6 Drawing Sheets

(52) U.S. Cl.
CPC .............. *H01L 28/86* (2013.01); *H01L 28/87* (2013.01); *H01L 28/88* (2013.01); *H01L 29/0673* (2013.01)

(58) Field of Classification Search
CPC ............. H01L 27/0647; H01L 27/0676; H01L 27/0711; H01L 27/0733; H01L 27/0794; H01L 27/0805; H01L 27/10805; H01L 27/10847; H01L 27/1255; H01L 2027/11842; H01L 28/40; H01L 28/60; H01L 28/86; H01L 28/87; H01L 28/88; H01L 2924/1205; H01L 2924/19041
See application file for complete search history.

(56) References Cited

U.S. PATENT DOCUMENTS

| | | | |
|---|---|---|---|
| 9,490,323 B2 | 11/2016 | Rodder et al. | |
| 9,640,532 B2 | 5/2017 | Gathman | |
| 9,653,287 B2 | 5/2017 | Rodder et al. | |
| 9,653,480 B1 | 5/2017 | Cheng et al. | |
| 9,685,499 B1* | 6/2017 | Bi | H01L 28/60 |
| 9,893,163 B2 | 2/2018 | Liu et al. | |
| 9,984,936 B1 | 5/2018 | Xie et al. | |
| 9,985,097 B2 | 5/2018 | Cheng et al. | |
| 9,991,334 B2* | 6/2018 | Bi | H01L 28/60 |
| 10,032,856 B1* | 7/2018 | Bao | H01L 29/41725 |
| 10,032,858 B2* | 7/2018 | Bi | H01L 28/60 |
| 2011/0065243 A1* | 3/2011 | Maxwell | G11C 13/0069 438/131 |
| 2014/0185187 A1* | 7/2014 | Bai | H01G 4/008 361/305 |
| 2015/0364611 A1* | 12/2015 | Funch | H01L 29/0688 257/532 |
| 2018/0240858 A1 | 8/2018 | Bi et al. | |
| 2020/0075582 A1* | 3/2020 | Lu | H01L 28/60 |

OTHER PUBLICATIONS

Sung-min Kim et al., "A study on selective Si0.8Ge0.2 etch using polysilicon etchant diluted by H2O for three-dimensional Si structure application," Silicon-on-insulator technology and devices XI: Proceedings of the international symposium, Electrochemical Society Proceedings Series Apr. 2003 (1 page).

* cited by examiner

HORIZONTAL-TRENCH CAPACITOR

FIELD OF THE INVENTION

The present invention relates to on-chip capacitors, and more particularly, to horizontal-trench on-chip capacitors having an ultra-small footprint and high capacitance density.

BACKGROUND OF THE INVENTION

High performance on-chip capacitors are needed for a variety of applications. For instance, high performance on-chip capacitors are used in communication systems (up-conversion/down-conversion), sampled analog application (analog-to-digital converters (ADC), filter, etc.) and microprocessors.

However, conventional capacitor designs have a number of notable drawbacks. For instance, metal-oxide semiconductor (MOS) capacitors, wire capacitors, and metal-insulator-metal (MIM) capacitors all suffer from relatively poor capacitor performance. Further, these designs require extra masks during the fabrication, thereby adding to production complexity and costs.

Therefore, a capacitor design with improved performance and manufacturability would be desirable.

SUMMARY OF THE INVENTION

The present invention provides horizontal-trench on-chip capacitors having an ultra-small footprint and high capacitance density. In one aspect of the invention, a method of forming a capacitor is provided. The method includes: forming alternating nanosheets of a sacrificial material and an active material on a wafer; patterning the nanosheets into at least one fin stack; burying the at least one fin stack in an interlayer dielectric (ILD); removing the ILD from a first side of the at least one fin stack, forming a first cavity in which ends of the nanosheets of the active material are exposed; filling the first cavity with a semiconductor material that interconnects the nanosheets of the active material; implanting ions into the nanosheets, the semiconductor material and the wafer; removing the ILD from a second side of the at least one fin stack forming a second cavity in which ends of the nanosheets of the active material are exposed; selectively removing the nanosheets of the sacrificial material, creating gaps between the nanosheets of the active material; depositing a dielectric into and lining the gaps and the second cavity; and filling the gaps and the second cavity with a conductor, wherein the conductor is interdigitated with the nanosheets of the active material, wherein the nanosheets of the active material and the semiconductor material serve as a cathode of the capacitor, and wherein the conductor serves as an anode of the capacitor.

In another aspect of the invention, another method of forming a capacitor is provided. The method includes: forming alternating nanosheets of a sacrificial material and an active material on a wafer, wherein the sacrificial material includes SiGe, and wherein the active material includes Si; patterning the nanosheets into at least one fin stack; burying the at least one fin stack in an ILD; removing the ILD from a first side of the at least one fin stack, forming a first cavity in which ends of the nanosheets of the active material are exposed; filling the first cavity with a semiconductor material that interconnects the nanosheets of the active material; implanting ions into the nanosheets, the semiconductor material and the wafer; annealing the nanosheets, the semiconductor material and the wafer; removing the ILD from a second side of the at least one fin stack forming a second cavity in which ends of the nanosheets of the active material are exposed; selectively removing the nanosheets of the sacrificial material, creating gaps between the nanosheets of the active material; depositing a dielectric into and lining the gaps and the second cavity; and filling the gaps and the second cavity with a conductor, wherein the conductor is interdigitated with the nanosheets of the active material, wherein the nanosheets of the active material and the semiconductor material serve as a cathode of the capacitor, and wherein the conductor serves as an anode of the capacitor.

In yet another aspect of the invention, a capacitor is provided. The capacitor includes: nanosheets of an active material on a wafer, wherein the active material is selected from: Si and SiGe; a semiconductor material interconnecting the nanosheets of the active material; ions implanted into the nanosheets of the active material, the semiconductor material and the wafer; a dielectric lining the gaps the nanosheets of the active material; and a conductor filling the gaps, wherein the conductor is interdigitated with the nanosheets of the active material, wherein the nanosheets of the active material and the semiconductor material serve as a cathode of the capacitor, and wherein the conductor serves as an anode of the capacitor.

A more complete understanding of the present invention, as well as further features and advantages of the present invention, will be obtained by reference to the following detailed description and drawings.

DETAILED DESCRIPTION OF PREFERRED EMBODIMENTS

Provided herein are nanosheet-based horizontal trench capacitors, and techniques for fabrication thereof. An exemplary methodology for forming the present horizontal-trench capacitors is now described by way of reference to FIGS. 1-12.

Figure 1:
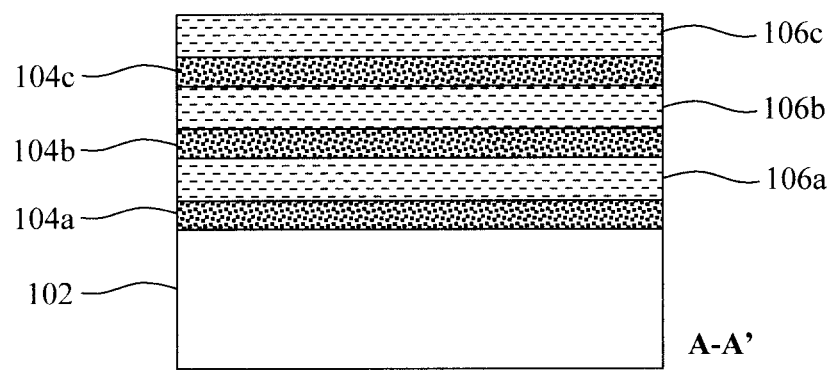
FIG. 1 is a cross-sectional diagram illustrating a stack of sacrificial and active nanosheets having been formed on a wafer according to an embodiment of the present invention.

The process begins with the formation of a stack of nanosheets on a wafer 102. See FIG. 1. As shown in FIG. 1, the stack includes alternating nanosheets of a sacrificial material 104a,b,c, etc. and an active material 106a,b,c,etc. The term 'nanosheet,' as used herein, refers to a sheet or a layer having nanoscale dimensions. Further, the term nanosheet may also be used interchangeably herein with the term nanowire when referring to a particular structure. For instance, nanosheet can be used to refer to a nanowire with a larger width, and/or nanowire may be used to refer to a nanosheet with a smaller width, and vice versa. By 'sacrificial' it is meant that material 104a,b,c,etc. will be selectively removed later in the process, releasing the nanosheets of active material 106a,b,c, etc. from the stack.

According to an exemplary embodiment, wafer 102 is a bulk semiconductor wafer. Suitable bulk semiconductor wafers include, but are not limited to, bulk wafers of silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs) and/or indium phosphide (InP).

Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

According to an exemplary embodiment, an epitaxial process is then used to grow alternating nanosheets of the sacrificial material 104a,b,c, etc. and the active material 106a,b,c,etc. as a stack on the wafer 102. The sacrificial and active materials employed permit etch removal of one material selective to the other. For instance, SiGe and Si offer such etch selectivity, whereby either SiGe or Si can be removed selective to the other. According to an exemplary embodiment SiGe is employed as the sacrificial material and Si as the active material. However, embodiments are contemplated herein where the functionalities of the materials are reversed, and Si serves as the sacrificial material and SiGe as the active material.

In the example shown in FIG. 1, the first nanosheet in the stack is an epitaxial layer of the sacrificial material 104a. A nanosheet of the active material 106a is then epitaxially grown on the sacrificial material 104a, and so on. According to an exemplary embodiment, the nanosheets of the sacrificial material 104a,b,c,etc. and the active material 106a,b, c,etc. each have a thickness of from about 10 nanometers (nm) to about 30 nm and ranges therebetween.

The number of nanosheets of sacrificial and active materials shown in the stack is merely an example. Namely, the stack can include more or fewer nanosheets than shown. In fact, the stack height is one parameter contemplated herein for tuning the capacitance of the present capacitor. Namely, increasing/decreasing the number of nanosheets in the stack to vary the stack height serves to increase/decrease the overall surface area and thus capacitance of the capacitor. The stack length as well as the dielectric type/thickness (see below) are other factors which can be varied to tune the capacitance.

Figure 2:
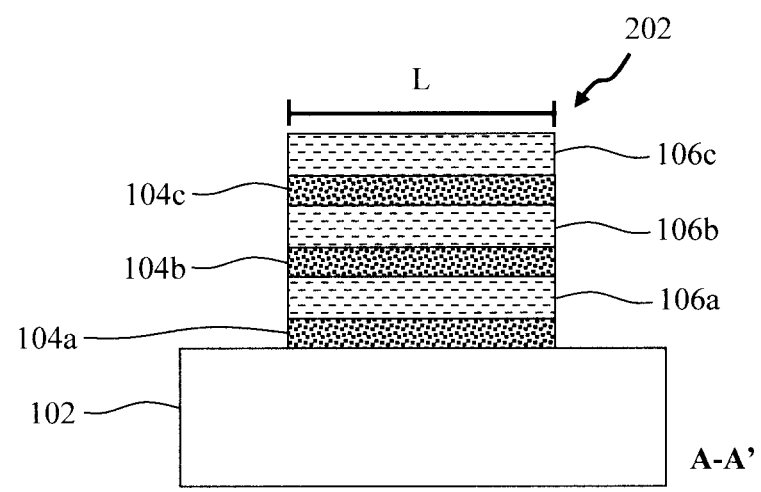
FIG. 2 is a cross-sectional diagram illustrating the stack having been patterned into at least one fin stack according to an embodiment of the present invention.

Standard lithography and etching techniques are then used to pattern the stack into at least one fin stack 202. See FIG. 2. A directional (anisotropic) etching process such as reactive ion etching (RIE) can be used for the fin etch. As shown in FIG. 2, the fin stack has a length L. As provided above, the length L of the stack is another parameter that can be used to tune the capacitance of the capacitor. Namely, increasing/decreasing the length of the nanosheets in the stack serves to increase/decrease the overall surface area and thus capacitance of the capacitor The fin stack 202 is then buried in an interlayer dielectric (ILD) 302 followed by a polishing process such as chemical mechanical polishing (CMP). See FIG. 3. Suitable ILDs include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Figure 3:
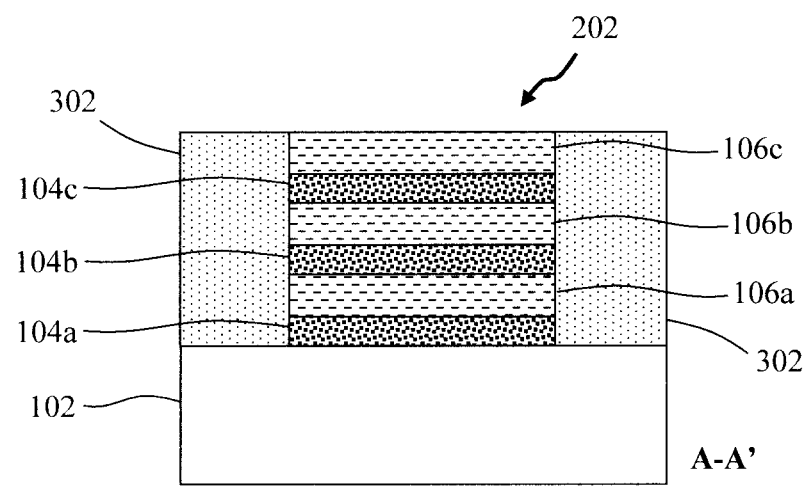
FIG. 3 is a cross-sectional diagram illustrating the fin stack having been buried in an interlayer dielectric (ILD) according to an embodiment of the present invention.

As shown in FIG. 3, at present the ILD 302 is disposed on both sides of the fin stack 202. However, the next task is to remove the ILD 302 from one side of the fin stack 202. See FIG. 4. Doing so provides access to each of the nanosheets of the active material 106a,b,c,etc. in the fin stack. The side of the fin stack 202 which the ILD 302 is removed from in this step is referred to herein generally as a 'first' side of the fin stack 202. In the present example, the first side is the right side of the fin stack 202. This is however arbitrary, and the ILD 302 can be removed from either the left or right side of the stack at this stage. The ILD 302 to remain is present on a 'second' side of the fin stack 202 (arbitrarily the left side of the fin stack in the present example).

By way of example only, a standard block mask (not shown) can be formed over/covering the fin stack 202 and the ILD 302 on the second side of the fins stack 202 (arbitrarily the ILD 302 to the left of the fin stack 202). An etch, such as a wet chemical etch or RIE, can then be used to clear the unmasked ILD 302 from the first side of the fin stack 202 (arbitrarily the ILD 302 to the right side of the fin stack 202), followed by removal of the block mask.

Figure 4:
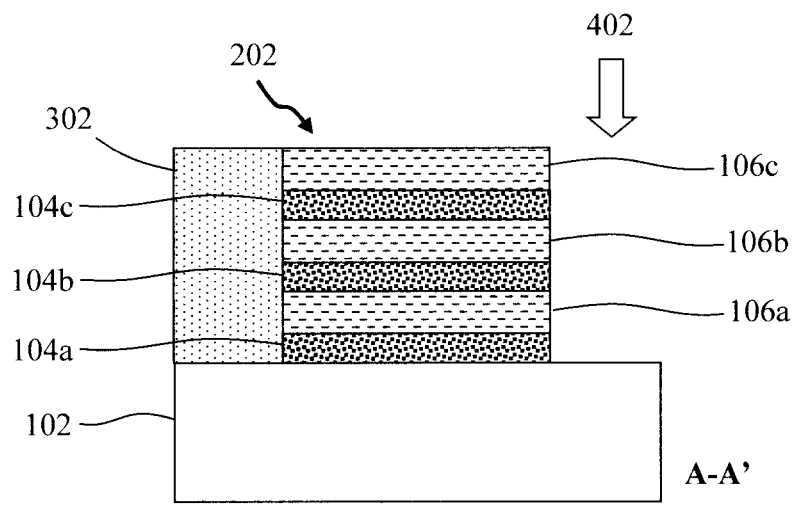
FIG. 4 is a cross-sectional diagram illustrating the ILD having been removed from a first side of the fin stack forming a first cavity in which the ends of the nanosheets of the active material are exposed according to an embodiment of the present invention.

As shown in FIG. 4, removal of the ILD 302 from the first (e.g., right) side of the fin stack 202 forms a cavity 402 in which the ends of the nanosheets of the active material 106a,b,c,etc. are exposed. Cavity 402 is then filled with a semiconductor material 502 that contacts the ends of the nanosheets of the active material 106a,b,c within the cavity 402. The semiconductor material 502 can be grown in cavity 402 using an epitaxial growth process or a quicker deposition process.

Preferably, the semiconductor material 502 formed in cavity 402 is the same material as that used for the nanosheets of active material 106a,b,c,etc. Thus, for example, when the nanosheets of active material 106a,b,c, etc. are formed from epitaxial or deposited Si, then the semiconductor material 502 filling cavity 402 is also epitaxial or deposited Si.

Figure 5:
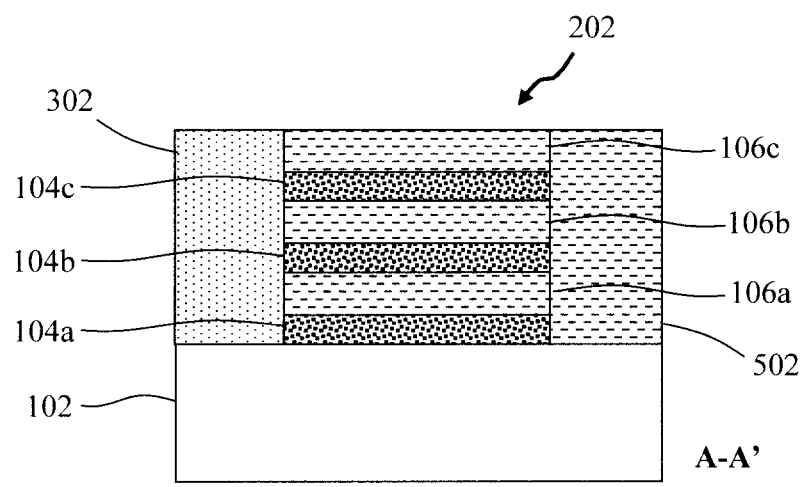
FIG. 5 is a cross-sectional diagram illustrating the first cavity having been filled with a semiconductor material that interconnects the nanosheets of the active material according to an embodiment of the present invention.
Figure 6:
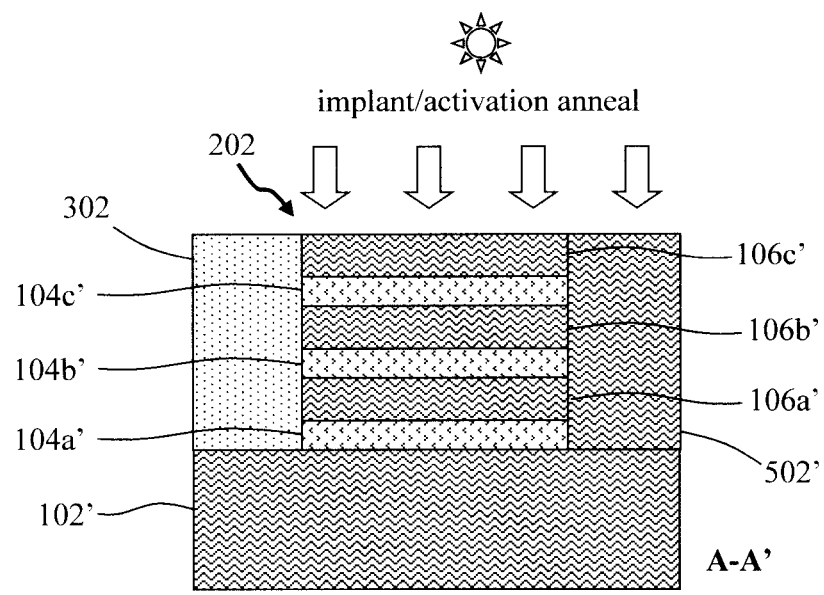
FIG. 6 is a cross-sectional diagram illustrating ions having been implanted into the nanosheets, the semiconductor material and the wafer, followed by an activation anneal according to an embodiment of the present invention.

As shown in FIG. 5, the nanosheets of the active material 106a,b,c,etc. in the fin stack 202 are now all interconnected via the semiconductor material 502 in cavity 402. Ions are then implanted into the nanosheets (sacrificial 104 and active 106)/semiconductor material 502/wafer 102, followed by an activation anneal. See FIG. 6. These structures are now given the reference numerals 104' and 106'/502'/102', respectively, and different patterning in the figures. The goal is to make the nanosheets of the active material 106a',b',c',etc., the semiconductor material 502', and the wafer 102' electrically conductive. As will be described in detail below, these structures will serve as a cathode of the capacitor. Implantation of the ions into the nanosheets of the sacrificial material 104a',b',c',etc. is inconsequential since these layers will be removed later on in the process.

According to an exemplary embodiment, the ions implanted into the nanosheets of active material 106/semiconductor material 502 are selected from phosphorous (P) ions and/or arsenic (As) ions, at a dose of from about $1 \times 10^{15}$ cm$^{-2}$ to about $1 \times 10^{15}$ cm$^{-2}$ and ranges therebetween. An anneal is then performed to activate the implanted ions. According to an exemplary embodiment, this activation anneal is performed at a temperature of from about 200 degrees Celsius (° C.) to about 250° C. and ranges therebetween.

The ILD 302 is then removed from the second (e.g., left) side of the fin stack 202. See FIG. 7. By way of example only, ILD 302 can be removed from the second/left side of the fin stack 202 using a selective etching process. For instance, when ILD 302 is formed from an oxide material, then an oxide-selective wet etch or RIE chemistry can be employed to clear the ILD 302.

Figure 7:
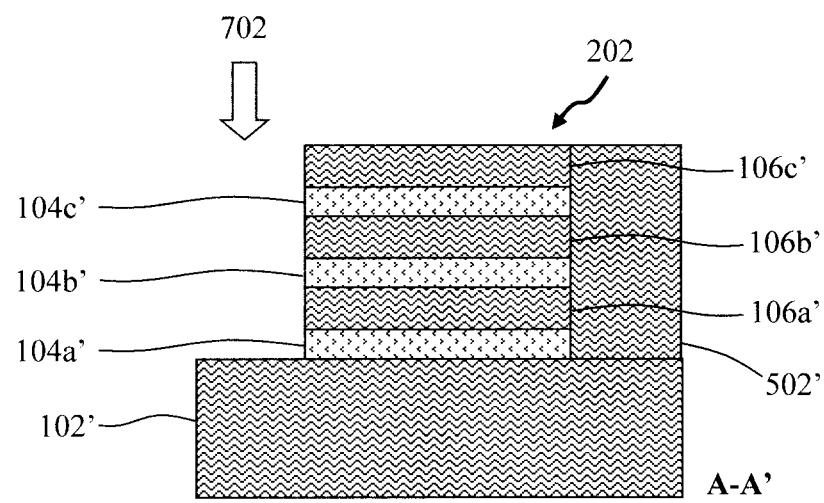
FIG. 7 is a cross-sectional diagram illustrating the ILD having been removed from a second side of the fin stack forming a second cavity in which the ends of the nanosheets of the sacrificial material are exposed according to an embodiment of the present invention.

As shown in FIG. 7, removal of the ILD 302 from the second (e.g., left) side of the fin stack 202 forms a cavity 702 in which the ends of the nanosheets of the sacrificial material 104a',b',c',etc. are exposed. Doing so enables the nanosheets of the sacrificial material 104a',b',c',etc. to be removed from the fin stack 202 selective to the nanosheets of the active material 106a',b',c',etc.

Figure 8:
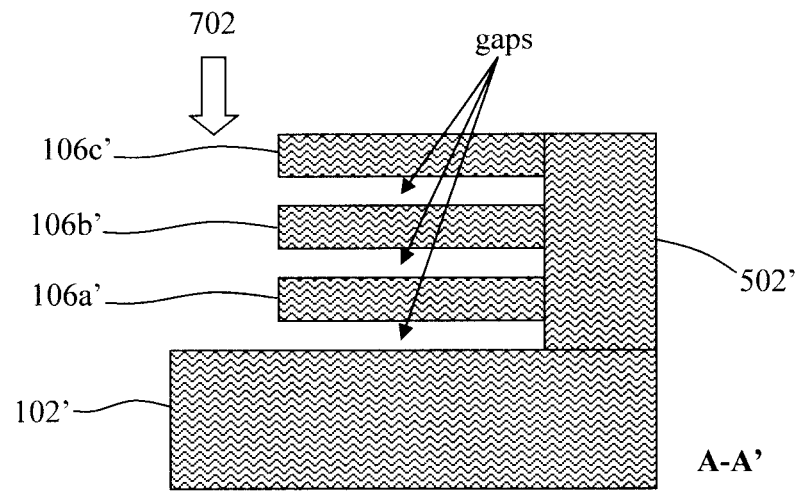
FIG. 8 is a cross-sectional diagram illustrating the nanosheets of the sacrificial material having been selectively removed, creating gaps between the nanosheets of the active material according to an embodiment of the present invention.

Namely, as shown in FIG. 8, the nanosheets of the sacrificial material 104a',b',c',etc. are selectively removed, thereby releasing the nanosheets of the active material 106a',b',c',etc. from the stack 202. As provided above, according to an exemplary embodiment, the sacrificial material 104' is SiGe and the active material 106' is Si. In that case, by way of example only, etchants such as wet hot SC1, vapor phase hydrogen chloride (HCl), vapor phase chlorine trifluoride (ClF$_3$) and other reactive clean processes (RCP) are selective for etching of SiGe versus Si. For instance, see Mertens et al., "Vertically Stacked Gate-All-Around Si Nanowire CMOS Transistors with Dual Work Function Metal Gates," 2016 IEEE International Electron Devices Meeting (IEDM) (December 2016) (4 pages) (vapor phase HCl), the contents of which are incorporated by reference as if fully set forth herein. The functions of these materials can be reversed, and embodiments are contemplated herein where the sacrificial material 104' is Si and the active material 106' is SiGe. In that case, by way of example only, ammonium hydroxide (NH$_4$OH), tetraethylammonium hydroxide (TEAH) and/or tetraethylammonium hydroxide (TMAH) can be used to etch Si versus SiGe.

As shown in FIG. 8, removal of the nanosheets of sacrificial material 104' creates gaps between the nanosheets of active material 106', and the nanosheets of active material 106' now form 'fingers' that extend horizontally from the semiconductor material 502'. These gaps will be filled with a dielectric and a conductor to form an anode of the capacitor.

Figure 9:
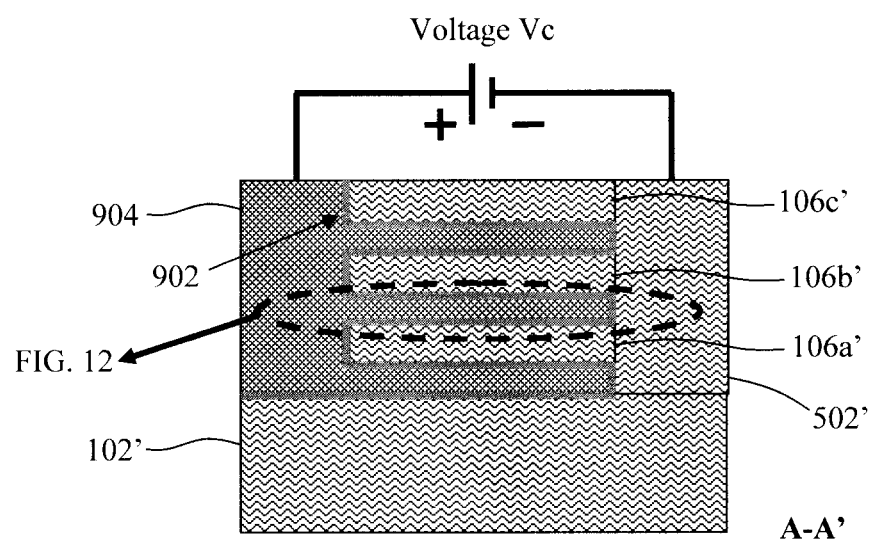
FIG. 9 is a cross-sectional diagram illustrating a dielectric having been conformally deposited into and lining the gaps and the second cavity, and the gaps and the second cavity having been filled with a conductor which forms horizontally-extending 'fingers' that are interdigitated with the nanosheets of the active material according to an embodiment of the present invention.

Namely, as shown in FIG. 9, a dielectric 902 is then conformally deposited into and lining the gaps and the cavity 702. Suitable dielectrics 902 include, but are not limited to, high-κ dielectrics such as hafnium oxide (HfO$_2$) and/or lanthanum oxide (La$_2$O$_3$). The term "high-κ" as used herein refers to a material having a relative dielectric constant κ which is much higher than that of silicon dioxide (e.g., a dielectric constant κ=25 for hafnium oxide (HfO$_2$) rather than 4 for silicon dioxide (SiO$_2$)). A conformal deposition process such as chemical vapor deposition (CVD), atomic layer deposition (ALD) or physical vapor deposition (PVD), etc. can be used to deposit the dielectric 902. According to an exemplary embodiment, the dielectric 902 is deposited to a thickness of from about 2 nm to about 5 nm and ranges therebetween.

The gaps and the cavity 702 are then filled with a conductor 904. Suitable conductors 904 include, but are not limited to, metals such as titanium nitride (TiN), tantalum nitride (TaN) and/or tungsten (W). A process such as CVD, ALD, PVD, electroplating, sputtering, evaporation, etc. can be used to deposit the conductor 904. A polishing process such as CMP can then be employed to remove the overburden. As shown in FIG. 9, the conductor 904 filled in the gaps also forms horizontally-extending 'fingers' that are interdigitated with the nanosheets of active material 106a',b',c', etc.

As provided above, the nanosheets of the active material 106a',b',c',etc (along with the semiconductor material 502' and wafer 102') serve as a cathode of the capacitor. The conductor 904 serves as the anode of the capacitor. Namely, as shown in FIG. 9, during operation a voltage bias (Vc) is applied to the conductor 904 and the semiconductor material 502' (which is made conductive via the ion implantation—see above). An enlarged view of conductor 904 filling one of the gaps is shown in FIG. 12 (described below).

Figure 10:
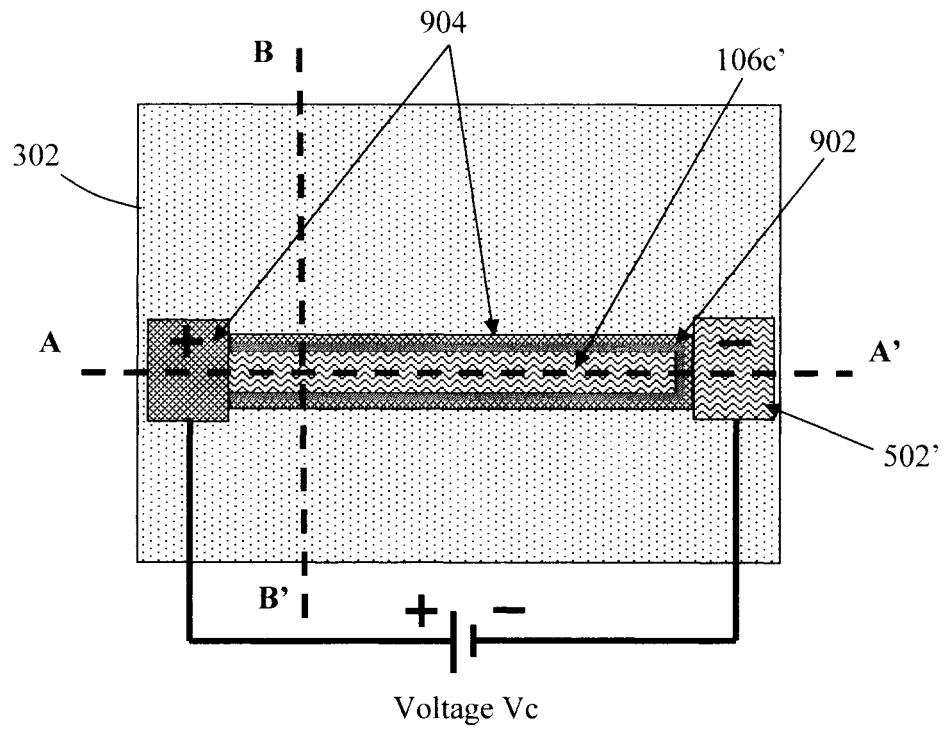
FIG. 10 is a top-down diagram illustrating the ILD surrounding the capacitor according to an embodiment of the present invention.
Figure 11:
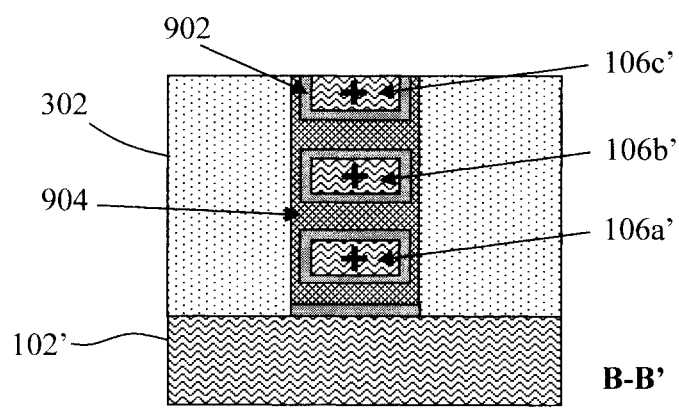
FIG. 11 is a cross-sectional diagram illustrating the alternating layers of the conductor separated from the nanosheets of the active material by the dielectric according to an embodiment of the present invention.
Figure 12:
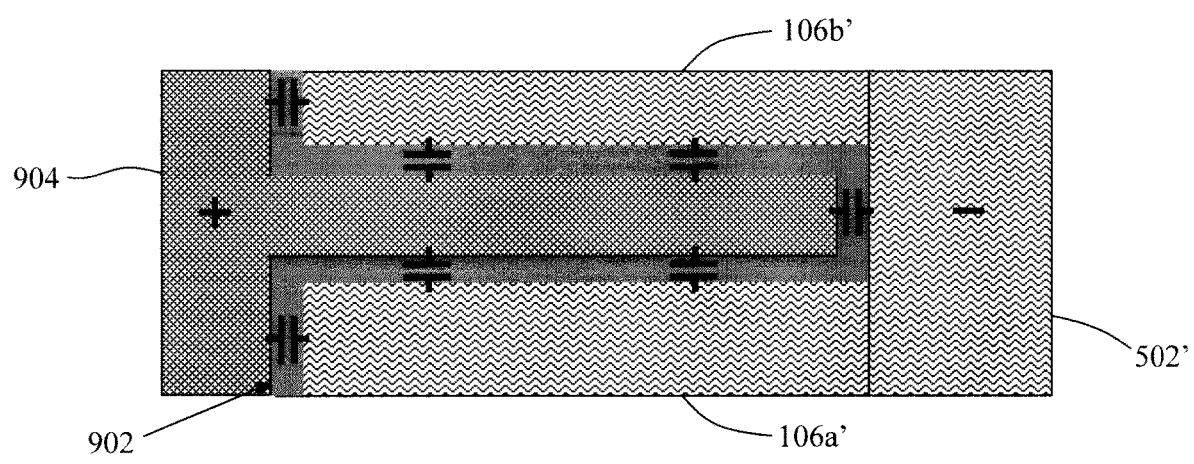
FIG. 12 is a cross-sectional diagram illustrating an enlarged view of the horizontally-extending 'fingers' of the conductor/nanosheets of active material according to an embodiment of the present invention.

To further illustrate operation of the capacitor, several different views of the device structure are provided in FIGS. 10-12. For example, FIG. 10 provides a top-down view of the capacitor. As provided above, after depositing the conductor 904, CMP can be performed. In this case, the device structure is polished down to the conductor 904 filling the top gap. As such, the conductor 904 is visible at the top surface of the structure in this top-down depiction. As shown in FIG. 10, ILD 302 surrounds the capacitor. A voltage bias (Voltage Vc) is applied to the conductor 904 (anode) and the semiconductor material 502' (cathode).

Notably, the preceding figures depict cross-sectional cuts along line A-A' of the device structure (i.e., parallel to the horizontally-extending 'fingers' of the conductor 904/ nanosheets of active material 106a',b',c',etc.). See FIG. 10 for the orientation of the cut along line A-A' of the device structure. A cross-sectional cut along line B-B' of the device structure (i.e., perpendicular to the horizontally-extending 'fingers' of the conductor 904/nanosheets of active material 106a',b',c',etc) is shown in FIG. 11.

As shown in FIG. 11, the capacitor includes alternating layers of nanosheets of active material 106a',b',c',etc. separated from conductor 904 by the dielectric 902. As provided above, ILD 302 surrounds the capacitor.

An enlarged view of the horizontally-extending 'fingers' of the conductor 904/nanosheets of active material 106a',b',c',etc) is shown in FIG. 12. As shown in FIG. 12, the surface area of the capacitor is vastly expanded by the present design. Namely, the interdigitated horizontally-extending 'fingers' of the conductor 904/nanosheets of active material 106a',b',c',etc., with dielectric 902 at the interface thereof, provide a surface area for the capacitor that extends around each of the 'fingers' and along the interface in between the 'fingers.'

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a capacitor, the method comprising the steps of:
   forming alternating nanosheets of a sacrificial material and an active material on a wafer;
   patterning the nanosheets into at least one fin stack;
   burying the at least one fin stack in an interlayer dielectric (ILD);
   removing the ILD from a first side of the at least one fin stack, forming a first cavity in which ends of the nanosheets of the active material are exposed;
   filling the first cavity with a semiconductor material that interconnects the nanosheets of the active material;
   implanting ions into the nanosheets, the semiconductor material and the wafer;
   removing the ILD from a second side of the at least one fin stack forming a second cavity in which ends of the nanosheets of the active material are exposed;
   selectively removing the nanosheets of the sacrificial material, creating gaps between the nanosheets of the active material;
   depositing a dielectric into and lining the gaps and the second cavity; and
   filling the gaps and the second cavity with a conductor, wherein the conductor is interdigitated with the nanosheets of the active material, wherein the nanosheets of the active material and the semiconductor material serve as a cathode of the capacitor, and wherein the conductor serves as an anode of the capacitor.

2. The method of claim 1, wherein the sacrificial material comprises silicon germanium (SiGe), and wherein the active material comprises silicon (Si).

3. The method of claim 1, wherein the ILD is selected from the group consisting of: silicon oxide (SiOx), organosilicate glass (SiCOH), porous organosilicate glass (pSiCOH), and combinations thereof.

4. The method of claim 1, wherein the semiconductor material comprises a same material as the active material.

5. The method of claim 1, wherein the ions are selected from the group consisting of: phosphorous (P) ions, arsenic (As) ions, and combinations thereof.

6. The method of claim 1, further comprising the step of:
   annealing the nanosheets, the semiconductor material and the wafer after implanting the ions.

7. The method of claim 6, wherein the annealing is performed at a temperature of from about 200° C. to about 250° C. and ranges therebetween.

8. The method of claim 1, wherein the dielectric comprises a high-κ dielectric selected from the group consisting of: hafnium oxide ($HfO_2$), lanthanum oxide ($La_2O_3$), and combinations thereof.

9. The method of claim 1, wherein the conductor comprises a metal selected from the group consisting of: titanium nitride (TiN), tantalum nitride (TaN), tungsten (W), and combinations thereof.

10. A method of forming a capacitor, the method comprising the steps of:
    forming alternating nanosheets of a sacrificial material and an active material on a wafer, wherein the sacrificial material comprises SiGe, and wherein the active material comprises Si;
    patterning the nanosheets into at least one fin stack;
    burying the at least one fin stack in an ILD;
    removing the ILD from a first side of the at least one fin stack, forming a first cavity in which ends of the nanosheets of the active material are exposed;
    filling the first cavity with a semiconductor material that interconnects the nanosheets of the active material;
    implanting ions into the nanosheets, the semiconductor material and the wafer;
    annealing the nanosheets, the semiconductor material and the wafer;
    removing the ILD from a second side of the at least one fin stack forming a second cavity in which ends of the nanosheets of the active material are exposed;
    selectively removing the nanosheets of the sacrificial material, creating gaps between the nanosheets of the active material;
    depositing a dielectric into and lining the gaps and the second cavity; and
    filling the gaps and the second cavity with a conductor, wherein the conductor is interdigitated with the nanosheets of the active material, wherein the nanosheets of the active material and the semiconductor material serve as a cathode of the capacitor, and wherein the conductor serves as an anode of the capacitor.

11. The method of claim 10, wherein the ILD is selected from the group consisting of: SiOx, SiCOH, pSiCOH, and combinations thereof.

12. The method of claim 10, wherein the semiconductor material comprises a same material as the active material.

13. The method of claim 10, wherein the ions are selected from the group consisting of: P ions, As ions, and combinations thereof.

14. The method of claim 10, wherein the annealing is performed at a temperature of from about 200° C. to about 250° C. and ranges therebetween.

15. The method of claim 10, wherein the dielectric comprises a high-κ dielectric selected from the group consisting of: $HfO_2$, $La_2O_3$, and combinations thereof.

16. The method of claim 10, wherein the conductor comprises a metal selected from the group consisting of: TiN, TaN, W, and combinations thereof.

17. A capacitor, comprising:
    nanosheets of an active material on a wafer, wherein the active material is selected from the group consisting of: Si and SiGe, and wherein gaps are present between the nanosheets of the active material;
    a semiconductor material interconnecting the nanosheets of the active material;

ions implanted into the nanosheets of the active material, the semiconductor material and the wafer;

a dielectric lining the gaps in the nanosheets of the active material; and a conductor filling the gaps, wherein the conductor is interdigitated with the nanosheets of the active material, wherein the nanosheets of the active material and the semiconductor material serve as a cathode of the capacitor, and wherein the conductor serves as an anode of the capacitor.

18. The capacitor of claim 17, wherein the ions are selected from the group consisting of: P ions, As ions, and combinations thereof.

19. The capacitor of claim 17, wherein the dielectric comprises a high-κ dielectric selected from the group consisting of: $HfO_2$, $La_2O_3$, and combinations thereof.

20. The capacitor of claim 17, wherein the conductor comprises a metal selected from the group consisting of: TiN, TaN, W, and combinations thereof.

\* \* \* \* \*